(12) United States Patent
Tang et al.

(10) Patent No.: US 12,408,477 B2
(45) Date of Patent: Sep. 2, 2025

(54) BACK-CONTACT SOLAR CELL, MANUFACTURING METHOD THEREFOR, AND SOLAR-CELL ASSEMBLY

(71) Applicant: LONGI GREEN ENERGY TECHNOLOGY CO., LTD., Xi'an (CN)

(72) Inventors: Xiyan Tang, Xi'an (CN); Liang Fang, Xi'an (CN)

(73) Assignee: LONGi Green Energy Technology Co., Ltd., Xi'an (CN)

( * ) Notice: Subject to any disclaimer, the term of this patent is extended or adjusted under 35 U.S.C. 154(b) by 0 days.

(21) Appl. No.: 18/728,629

(22) PCT Filed: Oct. 19, 2022

(86) PCT No.: PCT/CN2022/126218
§ 371 (c)(1),
(2) Date: Jul. 12, 2024

(87) PCT Pub. No.: WO2023/134249
PCT Pub. Date: Jul. 20, 2023

(65) Prior Publication Data
US 2025/0113652 A1    Apr. 3, 2025

(30) Foreign Application Priority Data
Jan. 17, 2022    (CN) .................. 202210052750.8

(51) Int. Cl.
H10F 77/20 (2025.01)
H10F 71/00 (2025.01)
H10F 77/30 (2025.01)
H10F 77/70 (2025.01)

(52) U.S. Cl.
CPC ......... *H10F 77/219* (2025.01); *H10F 71/138* (2025.01); *H10F 77/244* (2025.01);
(Continued)

(58) Field of Classification Search
CPC .... H10F 71/138; H10F 77/219; H10F 77/244; H10F 77/311; H10F 77/315; H10F 77/703
See application file for complete search history.

(56) References Cited

U.S. PATENT DOCUMENTS

| 9,570,637 B2 | 2/2017 | Matsubara et al. |
| 2015/0011043 A1* | 1/2015 | Shimizu ............... H10F 10/166 438/96 |

(Continued)

FOREIGN PATENT DOCUMENTS

| CN | 109216509 A | 1/2019 |
| CN | 110047965 A * | 7/2019 ........... H10F 10/166 |

(Continued)

OTHER PUBLICATIONS

Machine translation of CN-110047965-A, Lin, Jin-Shan. (Year: 2019).*

(Continued)

*Primary Examiner* — Mayla Gonzalez Ramos
(74) *Attorney, Agent, or Firm* — Fish & Richardson P.C.

(57) ABSTRACT

The present disclosure provides a back-contact solar cell, a fabrication method, and a solar-cell assembly. In one aspect, a back-contact solar cell includes a solar-cell body and an isolating groove. The solar-cell body includes a silicon substrate, a first semiconductor layer in a first region of a back surface of the silicon substrate, a second semiconductor layer having a portion in a second region of the back surface, and a transparent conductive film layer stacked on the first and second semiconductor layers. The isolating groove extends through the second semiconductor layer and the transparent conductive film layer. An area of a cross section (Continued)

of the isolating groove decreases towards the silicon substrate, and the cross section is parallel to the silicon substrate.

20 Claims, 7 Drawing Sheets

(52) U.S. Cl.
    CPC ......... *H10F 77/311* (2025.01); *H10F 77/315* (2025.01); *H10F 77/703* (2025.01)

(56) References Cited

U.S. PATENT DOCUMENTS

2016/0284896 A1\* 9/2016 Westerberg ........... H10F 10/146
2019/0207052 A1\* 7/2019 Masuko ................. H10F 10/10

FOREIGN PATENT DOCUMENTS

| CN | 113745357 A | 12/2021 |
| CN | 216597603 U | 5/2022 |
| CN | 217086578 U | 7/2022 |

OTHER PUBLICATIONS

Extended European Search Report in European Appln. No. 22919883.3, mailed on Mar. 12, 2025, 7 pages.
International Search Report and Written Opinion in International Appln. No. PCT/CN2022/126218, mailed on Jan. 5, 2023, 15 pages (with English translation).
Office Action in European Appln. No. 22919883.3, mailed on Apr. 1, 2025, 1 page.

\* cited by examiner

BACK-CONTACT SOLAR CELL, MANUFACTURING METHOD THEREFOR, AND SOLAR-CELL ASSEMBLY

CROSS-REFERENCE TO RELATED APPLICATIONS

This application is a National Stage of International Application No. PCT/CN2022/126218, filed on Oct. 19, 2022, which claims priority to Chinese Patent application Ser. No. 20/221,0052750.8, filed on Jan. 17, 2022. The disclosures of the aforementioned applications are hereby incorporated by reference in their entireties.

TECHNICAL FIELD

The present invention relates to the field of solar-cell technologies, and in particular, to a back-contact solar cell, a manufacturing method therefor, and a solar-cell assembly.

BACKGROUND

Back-contact solar cells have a wide application prospect due to a high open-circuit voltage and a high short-circuit current.

In an existing back-contact solar cell, semiconductor layers of different doping types are arranged immediately adjacent to each other, and consequently, a short circuit easily occurs in the cell.

SUMMARY

The present disclosure provides a back-contact solar cell, a manufacturing method therefor, and a solar-cell assembly, to resolve a problem of a short circuit in an existing back-contact solar cell.

According to a first aspect of the present invention, a back-contact solar cell is provided, including:

a solar-cell body, where the solar-cell body includes a silicon substrate, a first semiconductor layer located in a first region of a back surface of the silicon substrate, a blocking layer stacked on an end region of the first semiconductor layer, a second semiconductor layer stacked on the blocking layer and a second region of the back surface of the silicon substrate, and a transparent conductive film layer stacked on the first semiconductor layer and the second semiconductor layer. The first region and the second region are arranged immediately adjacent to each other. A doping type of the first semiconductor layer is different from a doping type of the second semiconductor layer.

A isolating groove is provided on the second semiconductor layer and the transparent conductive film layer. An area of a cross section of the isolating groove decreases toward the silicon substrate. A cross section of the isolating groove is parallel to the silicon substrate.

In this embodiment of the present invention, the isolating groove is provided on the second semiconductor layer and the transparent conductive film layer, to physically separate the first semiconductor layer and the second semiconductor layer with different doping types, so that the back-contact solar cell has a better insulation effect, and a problem of a short circuit is avoided. The cross section of the isolating groove is parallel to the silicon substrate, and the area of the cross section of the isolating groove decreases toward the silicon substrate, so that light incident from a light receiving surface of the silicon substrate can be incident at each position of the isolating groove, and the light incident at each position of the isolating groove is reflected and reaches the silicon substrate. Therefore, an intensity of the light incident at the silicon substrate is higher, so that power of electricity generated by the back-contact solar cell is increased, photoelectric conversion efficiency of the back-contact solar cell is improved, and an open-circuit voltage and a short-circuit current of the back-contact solar cell are further increased.

Optionally, a width of the cross section of the isolating groove decreases toward the silicon substrate, and a direction of the width of the cross section of the isolating groove is parallel to a direction along which the first region and the second region are arranged.

Optionally, a refractive index of the transparent conductive film layer and a refractive index of the second semiconductor layer are both greater than a refractive index of the blocking layer.

Optionally; the isolating groove is filled with an insulating material.

Optionally, the insulating material is light-permeable. The insulating material protrudes from the isolating groove in a direction away from the silicon substrate. The insulating material protruding from the isolating groove forms a hat-like structure. The hat-like structure includes a brim part and a crown part. An area of any cross section of the brim part is greater than an area of any cross section of the crown part. The brim part is closer to the isolating groove. The area of each cross section of the brim part increases toward the silicon substrate. An area of a cross section of an end of the brim part close to the silicon substrate is greater than or equal to an area of a cross section of an end of the isolating groove away from the silicon substrate. The cross sections are all parallel to the silicon substrate.

Optionally, a width of any cross section of the brim part is greater than a width of any cross section of the crown part. The width of each cross section of the brim part increases toward the silicon substrate.

A width of a cross section of an end of the brim part close to the isolating groove is greater than or equal to a width of the cross section of the end of the isolating groove away from the silicon substrate.

A direction of the width of the cross section of the brim part is parallel to a direction along which the first region and the second region are arranged.

Optionally, a refractive index of the insulating material is less than a refractive index of the blocking layer. The refractive index of the blocking layer is less than both a refractive index of the transparent conductive film layer and a refractive index of the second semiconductor layer.

Optionally, the refractive index of the insulating material ranges from 0.05 to 1.7, the refractive index of the transparent conductive film layer ranges from 1.86 to 4.9, the refractive index of the second semiconductor layer ranges from 1.86 to 4.9, and the refractive index of the blocking layer ranges from 1.85 to 2.1.

Optionally, the isolating groove includes a first groove portion on the second semiconductor layer and a second groove portion on the transparent conductive film layer.

A groove wall of the first groove portion includes a planar surface and/or a curvilinear surface:
and/or
a groove wall of the second groove portion includes a planar surface and/or a curvilinear surface.

Optionally, the groove wall of the first groove portion is a planar surface, the groove wall of the second groove portion is a planar surface, and the groove wall of the first groove portion and the groove wall of the second groove portion are distributed in a step shape, or the groove wall of the first groove portion forms a smooth transition with the groove wall of the second groove portion.

Alternatively, the groove wall of the first groove portion is a curvilinear surface, the groove wall of the second groove portion is a curvilinear surface, and the curvilinear surface of the groove wall of the first groove portion and the curvilinear surface of the groove wall of the second groove portion have a same curvature.

Optionally, the insulating material exactly fits a groove wall of the isolating groove.

Optionally, the insulating material includes an insulating ink and/or an insulating resin.

Optionally, the solar-cell body further includes a back surface on the blocking layer and a first passivation layer in the second region of the back surface of the silicon substrate. The first passivation layer is located between the second semiconductor layer and the silicon substrate. A refractive index of the first passivation layer is greater than the refractive index of the blocking layer.

The isolating groove is formed through the first passivation layer, the second semiconductor layer, and the transparent conductive film layer.

Optionally, a width of a cross section of an end of the isolating groove close to the silicon substrate ranges from 10 μm to 80 μm, and the width of the cross section of the end of the isolating groove away from the silicon substrate ranges from 20 μm to 90 μm.

A width of a cross section of an end of the brim part close to the silicon substrate ranges from 30 μm to 120 μm.

A width of a cross section of an end of the brim part away from the silicon substrate ranges from 20 μm to 110 μm.

The cross section of the end of the isolating groove close to the silicon substrate is parallel to the silicon substrate.

A direction of the width of the cross section of the end of the isolating groove close to the silicon substrate is parallel to the direction along which the first region and the second region are arranged.

Optionally, the back-contact solar cell further includes a first electrode and a second electrode.

The first electrode is located in a region of the transparent conductive film layer opposite to the first semiconductor layer.

The second electrode is located in a region of the transparent conductive film layer opposite to the second semiconductor layer.

The hat-like structure is located between the first electrode and the second electrode, and an end of the hat-like structure away from the silicon substrate protrudes out of the first electrode and the second electrode.

Optionally, a height by which the hat-like structure protrudes out of the first electrode ranges from 0.1 μm to 50 μm. A direction of the height is parallel to a stacking direction of the first semiconductor layer and the silicon substrate.

Optionally, a height of the blocking layer ranges from 100 nm to 500 nm, and a direction of the height is parallel to a stacking direction of the first semiconductor layer and the silicon substrate.

Optionally, the first region does not overlap the second region.

Optionally, the silicon substrate is an N-type silicon substrate, the first semiconductor layer is a P-type doped microcrystalline silicon layer, the second semiconductor layer is an N+ doped amorphous silicon layer, the blocking layer is a silicon nitride blocking layer, and the first passivation layer is an amorphous silicon layer.

Optionally, the first passivation layer is further distributed in the first region of the back surface of the silicon substrate, and the first passivation layer is located between the first semiconductor layer and the silicon substrate.

Optionally, the back-contact solar cell further includes an amorphous silicon passivation layer on a light receiving surface of the silicon substrate, and a silicon nitride anti-reflection layer on a light receiving surface of the amorphous silicon passivation layer; and/or the light receiving surface of the silicon substrate has a textured structure.

According to a second aspect of the present invention, a method for manufacturing a back-contact solar cell is further provided. The method is for manufacturing any one of the back-contact solar cells described above.

Optionally, the isolating groove is formed on the second semiconductor layer and the transparent conductive film layer by using a Gaussian beam.

Optionally, a wavelength of the Gaussian beam ranges from 900 nm to 1200 nm, and an energy density of the Gaussian beam ranges from 0.1 J/cm$^2$ to 0.5 J/cm$^2$.

Optionally, the method further includes: printing an insulating material in the isolating groove.

According to a third aspect of the present invention, a solar-cell assembly is further provided, including any one of the back-contact solar cells described above.

The foregoing descriptions are merely an overview of the technical solutions of the present invention. To understand the technical means of the present invention more clearly, the technical means of the present invention may be implemented according to content of this specification. In addition, to make the foregoing and other objectives, features, and advantages of the present invention clearer and more comprehensible, specific implementations of the present invention are described below:

BRIEF DESCRIPTION OF THE DRAWINGS

To describe the technical solutions in embodiments of the present invention more clearly, the accompanying drawings required for describing the embodiments of the present invention are briefly described below: It is clear that the accompanying drawings in the following descriptions are merely some embodiments of the present invention, and a person of ordinary skill in the art may further derive other drawings based on the accompanying drawings without creative efforts.

REFERENCE NUMERALS

1-silicon substrate, 2-first semiconductor layer, 3-blocking layer, 4-second semiconductor layer, 5-transparent conductive film layer, 6-isolating groove, 61-groove wall of a first groove portion, 62-groove wall of a second groove portion, 7-first passivation layer, 8-amorphous silicon passivation layer, 9-silicon nitride anti-reflection layer, 10-insulating material, 101-hat-like structure, 1011-brim part, 1012-crown part, 11-first electrode, and 12-second electrode.

DETAILED DESCRIPTION

The technical solutions in embodiments of the present invention are clearly and completely described below with reference to the accompanying drawings of the embodiments of the present invention. It is clear that the described embodiments are a part of the embodiments of the present invention, rather than all of the embodiments. Based on the embodiments of the present invention, all other embodiments obtained by a person of ordinary skill in the art without creative efforts shall fall within the protection scope of the present invention.

Figure 1:
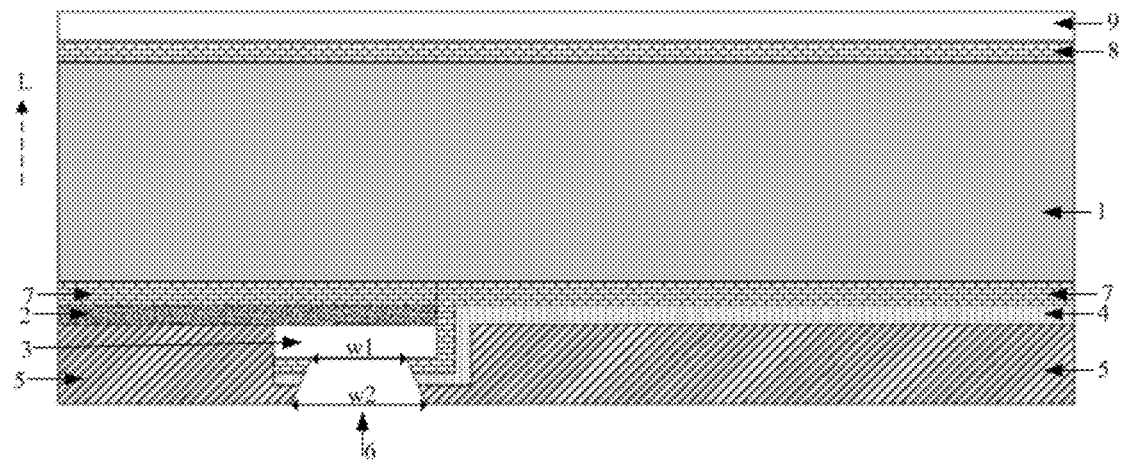
FIG. 1 is a schematic diagram of a partial structure of a first type of back-contact solar cell according to an embodiment of the present invention.

A back-contact solar cell may be an IBC solar cell (interdigitated back-contact solar cell), an HBC solar cell (heterojunction interdigitated back-contact solar cell), or the like. This is not specifically limited in the embodiments of the present invention. FIG. 1 is a schematic diagram of a partial structure of a first type of back-contact solar cell according to an embodiment of the present invention. As shown in FIG. 1, the back-contact solar cell includes a solar-cell body. The solar-cell body includes a silicon substrate 1. A doping type of the silicon substrate 1 is not specifically limited. A light receiving surface of the silicon substrate 1 is a surface of the silicon substrate 1 in the back-contact solar cell that receives light. A back surface of the silicon substrate 1 is a surface of the silicon substrate 1 that is opposite to the light receiving surface. The solar-cell body further includes a first semiconductor layer 2 located in a first region of the back surface of the silicon substrate 1, a blocking layer 3 stacked on an end region of the first semiconductor layer 2, a second semiconductor layer 4 stacked on the blocking layer 3 and a second region of the back surface of the silicon substrate 1, and a transparent conductive film layer 5 stacked on the first semiconductor layer 2 and the second semiconductor layer 4. The end region of the first semiconductor layer 2 may be an area that is on the first semiconductor layer 2 and that is close to an end of the second semiconductor layer 4. A relative size of the end region relative to the first semiconductor layer 2 is not specifically limited. The first region and the second region are arranged immediately adjacent to each other, and the relative size of the first region relative to the second region is not specifically limited. A doping type of the first semiconductor layer 2 is different from a doping type of the second semiconductor layer 4. One of the first semiconductor layer 2 and the second semiconductor layer 4 is P-type doped, and the other is N-type doped.

A isolating groove 6 is provided on the second semiconductor layer 4 and the transparent conductive film layer 5. The isolating groove 6 physically separates the first semiconductor layer 2 and the second semiconductor layer 4 with different doping types, so that the back-contact solar cell has a better insulation effect.

Figure 2:
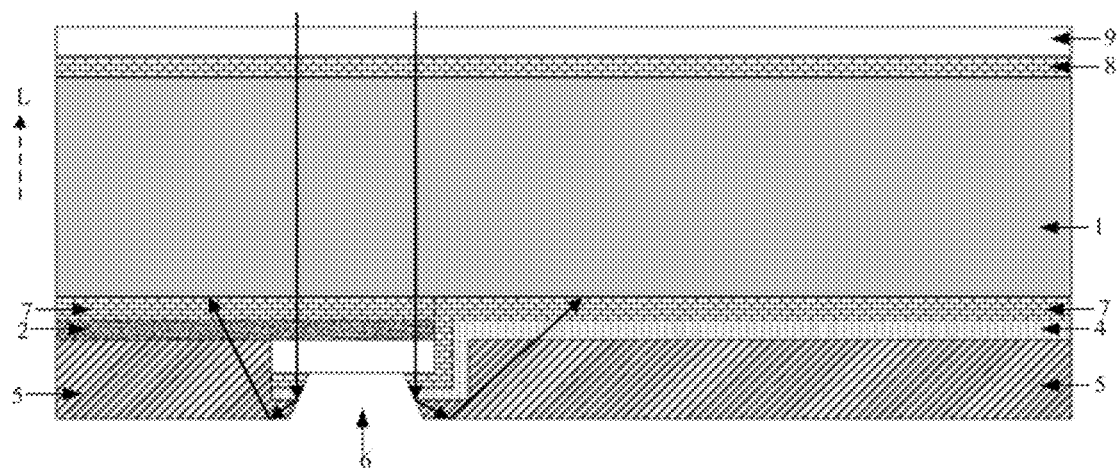
FIG. 2 is a schematic diagram of a part of light paths in a back-contact solar cell according to an embodiment of the present invention.

A direction shown by a dashed-line arrow L in FIG. 1 is a direction toward the silicon substrate 1. An area of a cross section of the isolating groove 6 decreases toward the silicon substrate 1, and the cross section of the isolating groove 6 is parallel to the silicon substrate 1. Cross sections described below are all parallel to the silicon substrate 1. FIG. 2 is a schematic diagram of a part of light paths in a back-contact solar cell according to an embodiment of the present invention. A thicker arrow in FIG. 2 shows light. As shown in FIG. 2, the cross section of the isolating groove 6 is parallel to the silicon substrate 1, and the area of the cross section of the isolating groove 6 decreases toward the silicon substrate 1, so that light incident from the light receiving surface of the silicon substrate 1 can be incident at each position of the isolating groove 6, and the light incident at each position of the isolating groove 6 is reflected and reaches the silicon substrate 1. Therefore, an intensity of the light incident at the silicon substrate 1 is higher, so that power of electricity generated by the back-contact solar cell is increased, photoelectric conversion efficiency of the back-contact solar cell is improved, and an open-circuit voltage and a short-circuit current of the back-contact solar cell are further increased.

Optionally, as shown in FIG. 1, a width of the cross section of the isolating groove 6 decreases toward the silicon substrate 1, and a direction of the width of the cross section of the isolating groove 6 is parallel to a direction along which the first region and the second region of the back surface of the silicon substrate 1 are arranged. Therefore, the light incident from the light receiving surface of the silicon substrate 1 can further be incident at each position of the isolating groove 6, and the light incident at each position of the isolating groove 6 is reflected and reaches the silicon substrate 1, so that the intensity of the light incident at the silicon substrate 1 is higher. For example, a width of a cross section of an end of the isolating groove 6 close to the silicon substrate 1 is w1, and a width of a cross section of an end of the isolating groove 6 away from the silicon substrate 1 is w2. In this case, w2>w1. It needs to be noted that widths mentioned below are all parallel to the direction along which the first region and the second region of the back surface of the silicon substrate 1 are arranged.

Optionally, a refractive index of the transparent conductive film layer 5 and a refractive index of the second semiconductor layer 4 are both greater than a refractive index of the blocking layer 3. Therefore, less light incident from the light receiving surface of the silicon substrate 1 is refracted to the outside of the back-contact solar cell, and more light is incident at each position of the isolating groove 6, so that the intensity of the light incident at the silicon substrate 1 is further improved.

Figure 3:
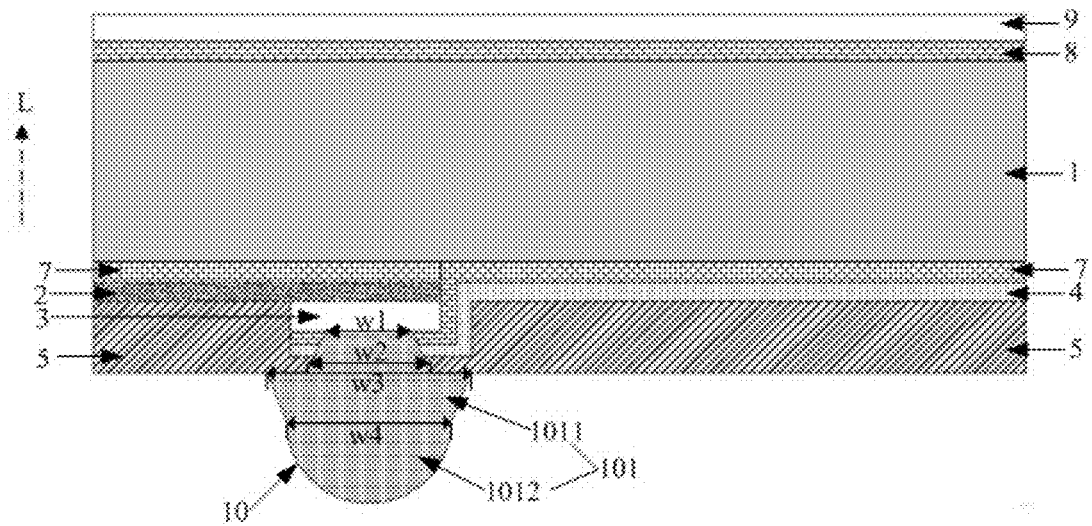
FIG. 3 is a schematic diagram of a partial structure of a second type of back-contact solar cell according to an embodiment of the present invention.

FIG. 3 is a schematic diagram of a partial structure of a second type of back-contact solar cell according to an embodiment of the present invention. Optionally, the isolating groove 6 is filled with an insulating material 10. On the basis that the isolating groove 6 is physically insulated, electrical insulation is further performed by using the insulating material 10, so that an insulation effect is optimized, and a fill factor of the back-contact solar cell is improved. In addition, the insulating material 10 can further reflect received light onto the silicon substrate 1, so that the intensity of the light incident at the silicon substrate 1 is higher. It needs to be noted that the insulating material 10 may be a thermosetting insulating material. The insulating material 10 may further have a strong acid-resistance characteristic or a strong alkali-resistance characteristic, so that the insulating material 10 has good stability during subsequent processing and use.

Optionally, the insulating material 10 includes an insulating ink and/or an insulating resin. A good insulation effect is achieved, and costs are low:

Optionally, the insulating material 10 is light-permeable, and the light received from the light receiving surface of the silicon substrate 1 can be transmitted into the insulating material 10. Strength of light permeability of the insulating material 10 is not specifically limited. The insulating material 10 protrudes from the isolating groove 6 in a direction away from the silicon substrate 1. The insulating material 10 protruding from the isolating groove 6 forms a hat-like structure 101. The hat-like structure 101 includes a brim part 1011 and a crown part 1012. An area of any cross section of the brim part 1011 is greater than an area of any cross section of the crown part 1012. The brim part 1011 is closer to the isolating groove 6 than the crown part 1012. The area of each cross section of the brim part 1011 increases toward the silicon substrate 1, in other words, in the direction shown by the dashed-line arrow L in the figure. An area of a cross section of an end of the brim part 1011 close to the isolating groove 6 is greater than or equal to an area of a cross section of an end of the isolating groove 6 away from the silicon substrate 1. The foregoing cross sections are all parallel to the silicon substrate 1.

Figure 4:
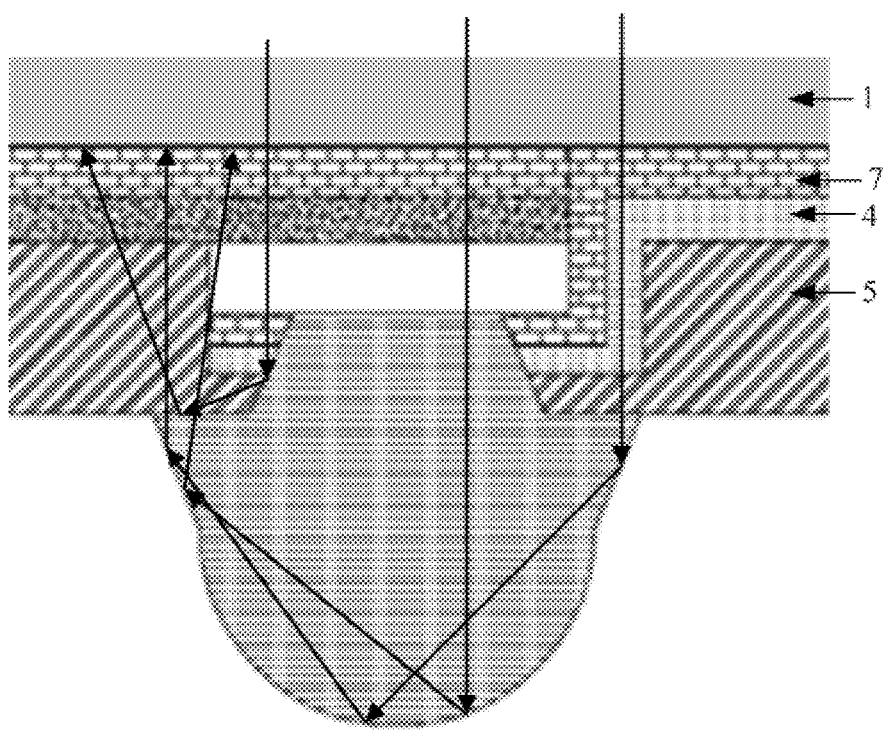
FIG. 4 is a schematic diagram of a part of light paths in an insulating material in a back-contact solar cell according to an embodiment of the present invention.

FIG. 4 is a schematic diagram of a part of light paths in an insulating material in a back-contact solar cell according to an embodiment of the present invention. A thicker arrow in FIG. 4 shows light. As shown in FIG. 4, if the light incident from the light receiving surface of the silicon substrate 1 is incident at the isolating groove 6, the light is reflected by the isolating groove 6 and reaches the transparent conductive film layer 5, and is reflected by the transparent conductive film layer 5 and reaches the silicon substrate 1. If the light is incident at the brim part 1011, the light may be reflected by the brim part 1011 and reaches the crown part 1012, then the light is reflected by the crown part 1012 and incident at the brim part 1011 again, and the light is reflected and reaches the silicon substrate 1. If the light is incident at the crown part 1012, the light may be reflected by the crown part 1012 and incident at the brim part 1011 again, and then the light is reflected and reaches the silicon substrate 1. Therefore, the intensity of the light incident at the silicon substrate 1 is higher, so that the power of the electricity generated by the back-contact solar cell is increased, the photoelectric conversion efficiency of the back-contact solar cell is improved, and the open-circuit voltage and the short-circuit current of the back-contact solar cell are further increased.

Optionally, as shown in FIG. 3, a width of any cross section of the brim part 1011 is greater than a width of any cross section of the crown part 1012, so that the insulating material 10 can receive incident light of a large range.

The width of each cross section of the brim part 1011 increases toward the silicon substrate 1, in other words, in the direction shown by the dashed-line arrow L in the figure. Parts of the brim part 1011 are not blocked by each other, and all can receive light. For example, in FIG. 4, a width of a cross section of an end of the brim part 1011 away from the silicon substrate 1 is w4, and a width of a cross section of an end of the brim part 1011 close to the silicon substrate 1 is w3, where w3>w4.

w3 represents the width of the cross section of the end of the brim part 1011 close to the silicon substrate 1, i.e., a width of a cross section of an end of the brim part 1011 close to the isolating groove 6. The width of the cross section of the end of the isolating groove 6 away from the silicon substrate 1 is w2, where w3>w2. After an electrode is subsequently disposed, the brim part 1011 of the foregoing structure can prevent the electrode from contacting the second semiconductor layer 4, to avoid an adverse effect of the electrode on the second semiconductor layer 4.

A direction of the width of the cross section of the brim part 1011 is parallel to a direction along which the first region and the second region are arranged.

Optionally, a refractive index of the insulating material 10 is less than a refractive index of the blocking layer 3, and the refractive index of the blocking layer 3 is less than both a refractive index of the transparent conductive film layer 5 and a refractive index of the second semiconductor layer 4. Therefore, less light is refracted out of the back-contact solar cell, and more light is reflected by the isolating groove 6 and the insulating material 10 and reaches the silicon substrate 1, to further improve the intensity of the light incident at the silicon substrate 1.

Optionally, the refractive index of the insulating material 10 ranges from 0.05 to 1.7, the refractive index of the transparent conductive film layer 5 ranges from 1.86 to 4.9, the refractive index of the second semiconductor layer 4 ranges from 1.86 to 4.9, and the refractive index of the blocking layer 3 ranges from 1.85 to 2.1. In the foregoing distribution manner of the refractive indexes, the refractive indexes of the structures match well, so that the light refracted out of the back-contact solar cell can be further reduced, and the light that is reflected by the isolating groove 6 and the insulating material 10 and reaches the silicon substrate 1 is further increased.

Optionally, the isolating groove 6 includes a first groove portion on the second semiconductor layer 4 and a second groove portion on the transparent conductive film layer 5. A groove wall of the first groove portion includes a planar surface and/or a curvilinear surface. In other words, the groove walls of the first groove portion on the second semiconductor layer 4 may all be planar surfaces or curvilinear surfaces, or may be a combination of a planar surface and a curvilinear surface. The first groove portion has various forms. In addition/Alternatively, a groove wall of the second groove portion includes a planar surface and/or a curvilinear surface. In other words, the groove walls of the second groove portion on the transparent conductive film layer 5 may all be planar surfaces or curvilinear surfaces, or may be a combination of a planar surface and a curvilinear surface. The second groove portion has various forms.

Figure 5:
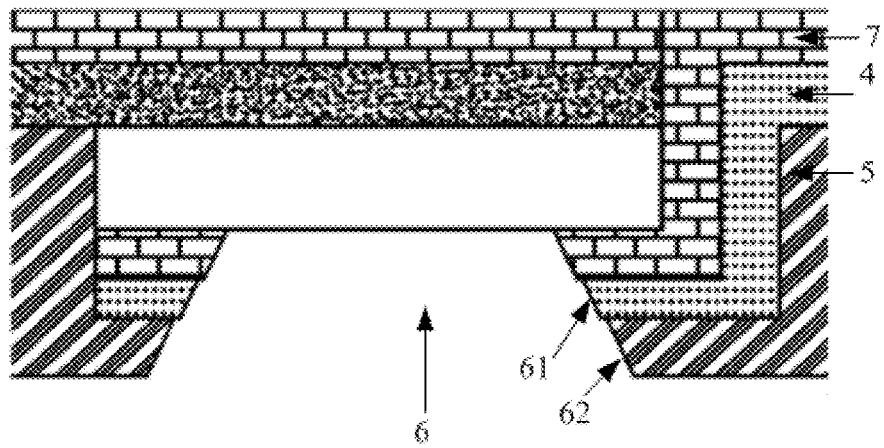
FIG. 5 is a schematic diagram of a partial structure of a third type of back-contact solar cell according to an embodiment of the present invention.
Figure 6:
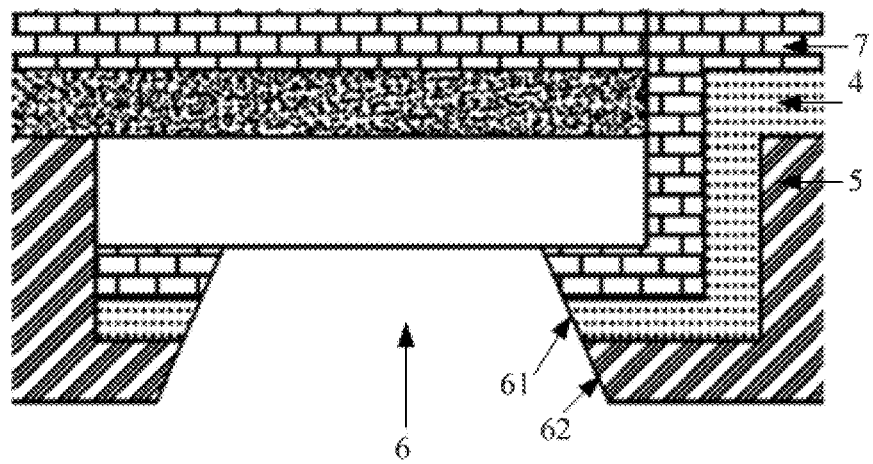
FIG. 6 is a schematic diagram of a partial structure of a fourth type of back-contact solar cell according to an embodiment of the present invention.
Figure 7:
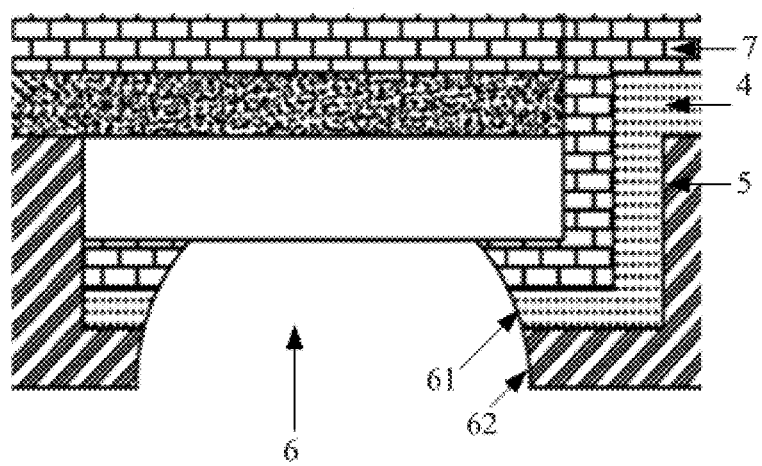
FIG. 7 is a schematic diagram of a partial structure of a fifth type of back-contact solar cell according to an embodiment of the present invention.

FIG. 5 is a schematic diagram of a partial structure of a third type of back-contact solar cell according to an embodiment of the present invention. FIG. 6 is a schematic diagram of a partial structure of a fourth type of back-contact solar cell according to an embodiment of the present invention. FIG. 7 is a schematic diagram of a partial structure of a fifth type of back-contact solar cell according to an embodiment of the present invention. For example, as shown in FIG. 5 and FIG. 6, the groove walls 61 of the first groove portion are all planar surfaces, and the groove walls 62 of the second groove portion are all planar surfaces. In FIG. 7, the groove walls 61 of the first groove portion are all curvilinear surfaces, and the groove walls 62 of the second groove portion are all curvilinear surfaces.

Optionally, as shown in FIG. 5 and FIG. 6, the groove wall 61 of the first groove portion is a planar surface, and the groove wall 62 of the second groove portion is a planar surface. In FIG. 5, the groove wall 61 of the first groove portion and the groove wall 62 of the second groove portion are distributed in a step shape. Alternatively, in FIG. 6, the groove wall 61 of the first groove portion forms a smooth transition with the groove wall 62 of the second groove portion, and the planar surface of the groove wall 61 of the first groove portion and the planar surface of the groove wall 62 of the second groove portion have a same slope. The isolating groove 6 has various forms.

Optionally, as shown in FIG. 7, the groove wall 61 of the first groove portion is a curvilinear surface, and the groove wall 62 of the second groove portion is a curvilinear surface. The curvilinear surface of the groove wall 61 of the first groove portion and the curvilinear surface of the groove wall 62 of the second groove portion have a same curvature. The groove wall 61 of the first groove portion and the groove wall 62 of the second groove portion may be on a same circle, so that it is convenient to process the isolating groove 6.

Optionally, as shown in FIG. 3 and FIG. 4, the insulating material 10 exactly fits a groove wall of the isolating groove 6. Therefore, the subsequent electrode does not enter between the insulating material 10 and the isolating groove 6, so that not only a waste of an electrode material can be reduced, but also a short circuit can be effectively prevented.

Optionally, referring to FIG. 1 to FIG. 7, the solar-cell body further includes a back surface on the blocking layer 3 and a first passivation layer 7 in the second region of the back surface of the silicon substrate 1. The first passivation layer 7 is located between the second semiconductor layer 4 and the silicon substrate 1. A refractive index of the first passivation layer 7 is greater than the refractive index of the blocking layer 3. Therefore, a passivation function is good, and less light is refracted out of the back-contact solar cell.

The isolating groove 6 is formed through the first passivation layer 7, the second semiconductor layer 4, and the transparent conductive film layer 5. A shape or the like of a groove wall of a groove portion of the isolating groove 6 on the first passivation layer 7 is not specifically limited.

Optionally, as shown in FIG. 1 and FIG. 3, the width w1 of the cross section of the end of the isolating groove 6 close to the silicon substrate 1 ranges from 10 µm (micrometer) to 80 µm, and the width w2 of the cross section of the end of the isolating groove 6 away from the silicon substrate 1 ranges from 20 µm to 90 µm. A light reflection effect and an insulation effect of the isolating groove 6 of the foregoing size are both good.

Optionally, as shown in FIG. 3, the width w3 of the cross section of the end of the brim part 1011 close to the silicon substrate 1 ranges from 30 µm to 120 µm, and the width w4 of the cross section of the end of the brim part 1011 away from the silicon substrate 1 ranges from 20 µm to 110 µm. A light reflection effect and an insulation effect of the brim part 1011 of the foregoing size are both good.

Figure 8:
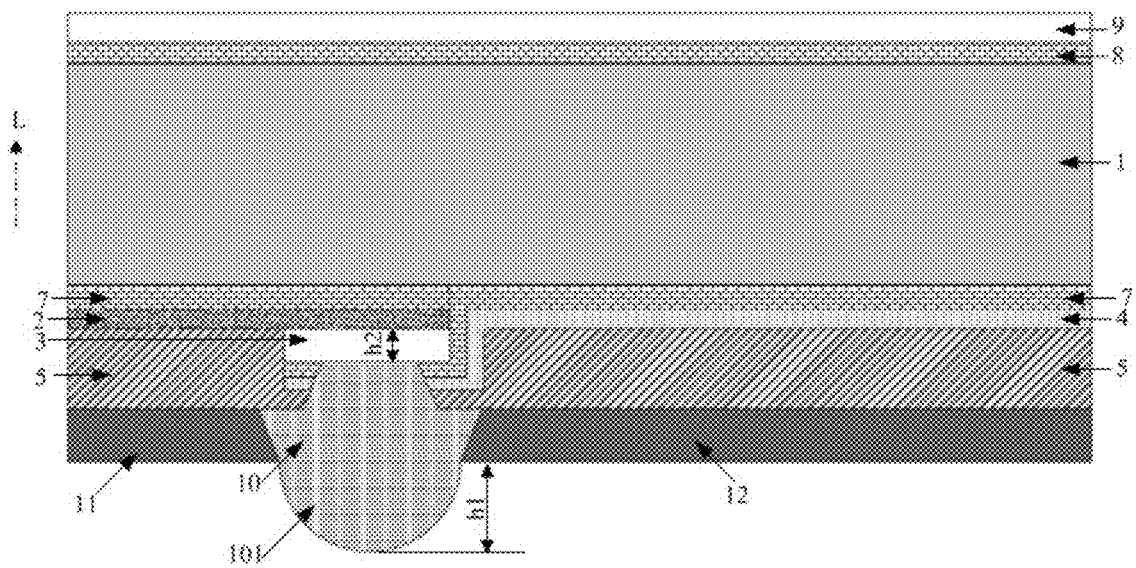
FIG. 8 is a schematic diagram of a structure of a back-contact solar cell according to an embodiment of the present invention.

FIG. 8 is a schematic diagram of a structure of a back-contact solar cell according to an embodiment of the present invention. As shown in FIG. 8, the back-contact solar cell further includes a first electrode 11 and a second electrode 12. The first electrode 11 is located in a region of the transparent conductive film layer 5 opposite to the first semiconductor layer 2. The second electrode 12 is located in a region of the transparent conductive film layer 5 opposite to the second semiconductor layer 4.

Optionally, as shown in FIG. 8, the hat-like structure 101 is located between the first electrode 11 and the second electrode 12, and an end of the hat-like structure 101 away from the silicon substrate 1 protrudes out of the first electrode 11 and the second electrode 12. The hat-like structure 101 protrudes out of the first electrode 11 and the second electrode 12, so that a short circuit between the first electrode 11 and the second electrode 12 can be sufficiently prevented. Specifically, whether both the brim part and the crown part include a part that protrudes out of the first electrode 11 or only the crown part includes a part that protrudes out of the first electrode is not specifically limited.

Optionally, as shown in FIG. 8, a height h1 by which the hat-like structure 101 protrudes out of the first electrode 11 ranges from 0.1 µm to 50 µm. The height range can not only well prevent a short circuit between the first electrode 11 and the second electrode 12, but also prevent the protruding part from causing a large stress during formation of a solar-cell assembly. A direction of the height h1 by which the hat-like structure 101 protrudes out of the first electrode 11 is parallel to a stacking direction of the first semiconductor layer 2 and the silicon substrate 1. Directions of heights mentioned below are all parallel to the stacking direction of the first semiconductor layer 2 and the silicon substrate 1.

Optionally, as shown in FIG. 8, a height h2 of the blocking layer 3 ranges from 100 nm to 500 nm. The blocking layer provides a good separation effect when its height falls within this range.

Optionally, referring to FIG. 1 to FIG. 4, and FIG. 8, the first region does not overlap the second region, so that a good insulation effect is achieved.

Optionally, the silicon substrate 1 is an N-type silicon substrate, the first semiconductor layer 2 is a P-type doped microcrystalline silicon layer, the second semiconductor layer 4 is an N+ doped amorphous silicon layer, the blocking layer 3 is a silicon nitride blocking layer, and the first passivation layer 7 is an amorphous silicon layer.

Optionally, referring to FIG. 1 to FIG. 4, and FIG. 8, the first passivation layer 7 is further distributed in the first region of the back surface of the silicon substrate 1, and the first passivation layer 7 is located between the first semiconductor layer 2 and the silicon substrate 1, so that a good passivation effect is achieved.

Optionally, as shown in FIG. 1 to FIG. 3, and FIG. 8, the back-contact solar cell further includes an amorphous silicon passivation layer 8 on the light receiving surface of the silicon substrate 1, and a silicon nitride ($SiN_x$) anti-reflection layer 9 on a light receiving surface of the amorphous silicon passivation layer 8. A value of x is not specifically limited. The amorphous silicon passivation layer 8 may be an intrinsic amorphous silicon layer.

Optionally, the light receiving surface of the silicon substrate 1 has a textured structure, to further extend an optical path of light in the back-contact solar cell.

The present invention further provides a solar-cell assembly, including any one of the back-contact solar cells described above. The solar-cell assembly has a beneficial effect the same as or similar to those of the back-contact solar cells described above. To avoid repetition, details are not described herein again.

An embodiment of the present invention further provides a method for manufacturing a back-contact solar cell. The method is for manufacturing any one of the back-contact solar cells described above. The method for manufacturing a back-contact solar cell has a beneficial effect the same as or similar to those of the back-contact solar cells described above.

Optionally, the method for manufacturing a back-contact solar cell may further include the following step: forming the isolating groove 6 on the second semiconductor layer 4 and the transparent conductive film layer 5 by using a Gaussian beam. The foregoing grooving method is simple, and an adverse effect such as pollution on a solar-cell body is small. For example, the isolating groove 6 is provided by using a Gaussian spot laser.

Figure 9:
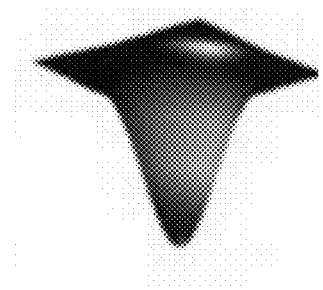
FIG. 9 is a schematic diagram of energy distribution of a Gaussian beam for grooving according to an embodiment of the present invention.

FIG. 9 is a schematic diagram of energy distribution of a Gaussian beam for grooving according to an embodiment of the present invention. It can be seen from FIG. 9 that, energy of a laser spot is conically distributed. The energy is high in a center and gradually decreases in a peripheral direction. As shown in FIG. 9, optionally, a wavelength of the Gaussian beam ranges from 900 nm (nanometer) to 1200 nm, and an energy density of the Gaussian beam ranges from 0.1 J/cm$^2$ (joules per square centimeter) to 0.5 J/cm$^2$. The isolating groove is provided at a faster speed by using the Gaussian beam.

Optionally, the method may further include: printing an insulating material 10 in the isolating groove 6. A manner of disposing the insulating material 10 is simple.

Figure 10:
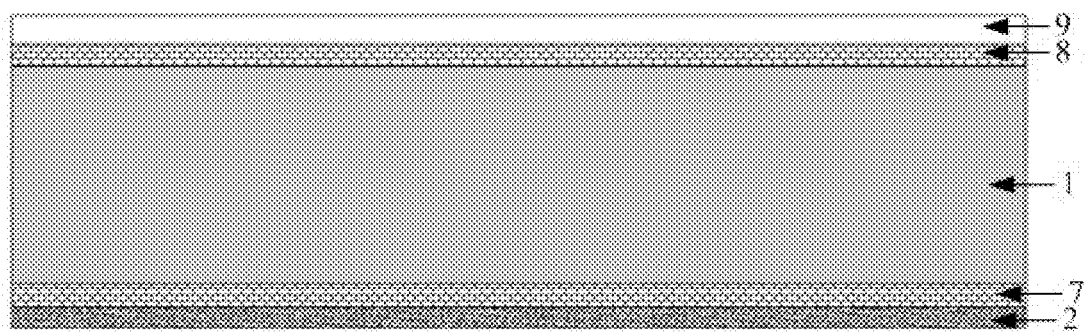
FIG. 10 is a schematic diagram of a partial structure of a sixth type of back-contact solar cell according to an embodiment of the present invention.
Figure 11:
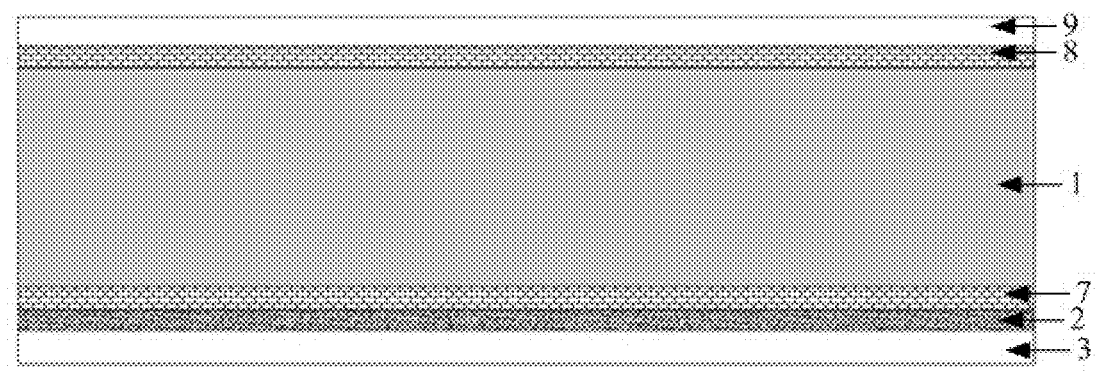
FIG. 11 is a schematic diagram of a partial structure of a seventh type of back-contact solar cell according to an embodiment of the present invention.
Figure 12:
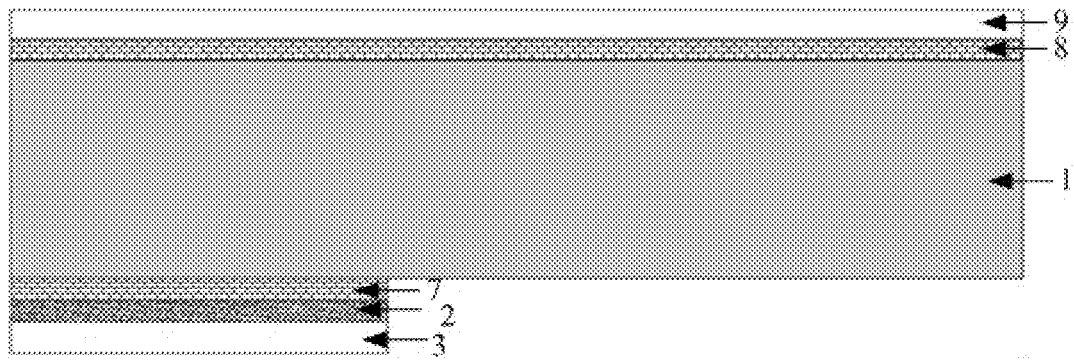
FIG. 12 is a schematic diagram of a partial structure of an eighth type of back-contact solar cell according to an embodiment of the present invention.
Figure 13:
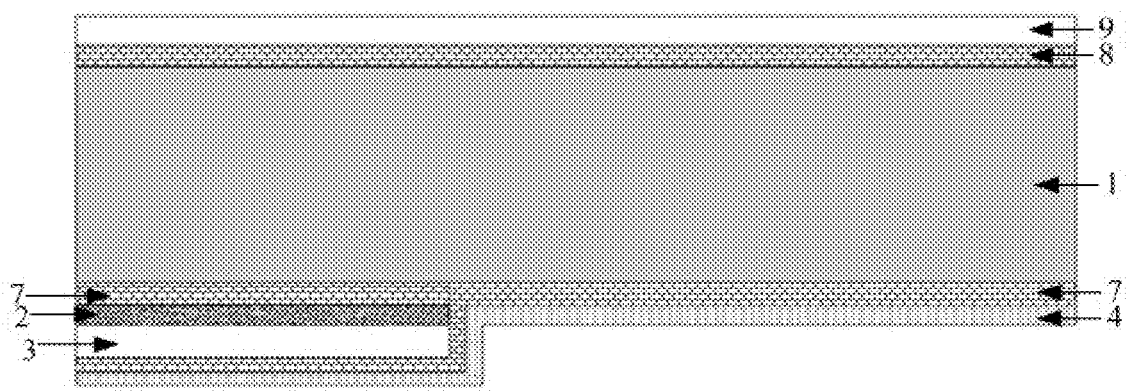
FIG. 13 is a schematic diagram of a partial structure of a ninth type of back-contact solar cell according to an embodiment of the present invention.
Figure 14:
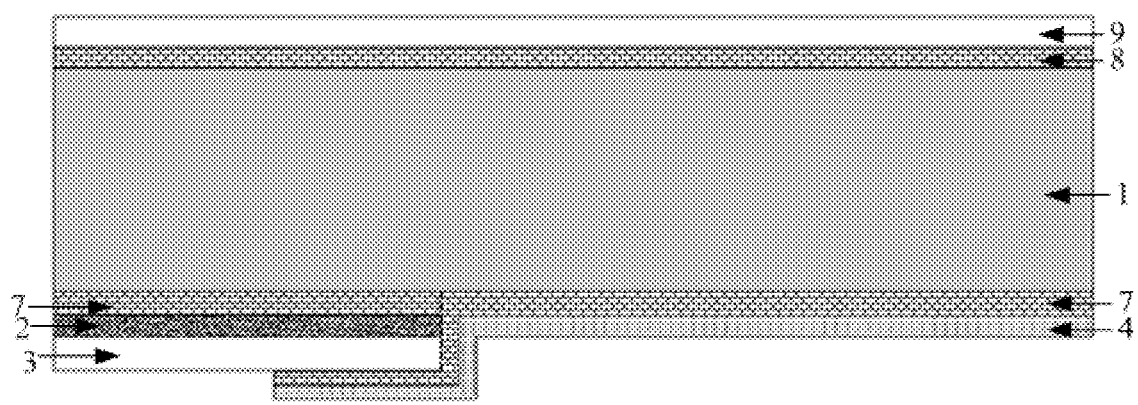
FIG. 14 is a schematic diagram of a partial structure of a tenth type of back-contact solar cell according to an embodiment of the present invention.
Figure 15:
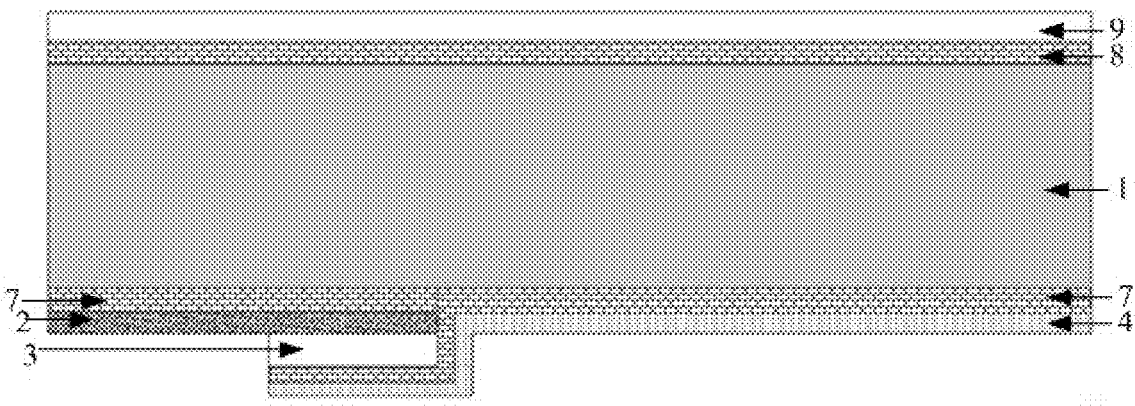
FIG. 15 is a schematic diagram of a partial structure of an eleventh type of back-contact solar cell according to an embodiment of the present invention.
Figure 16:
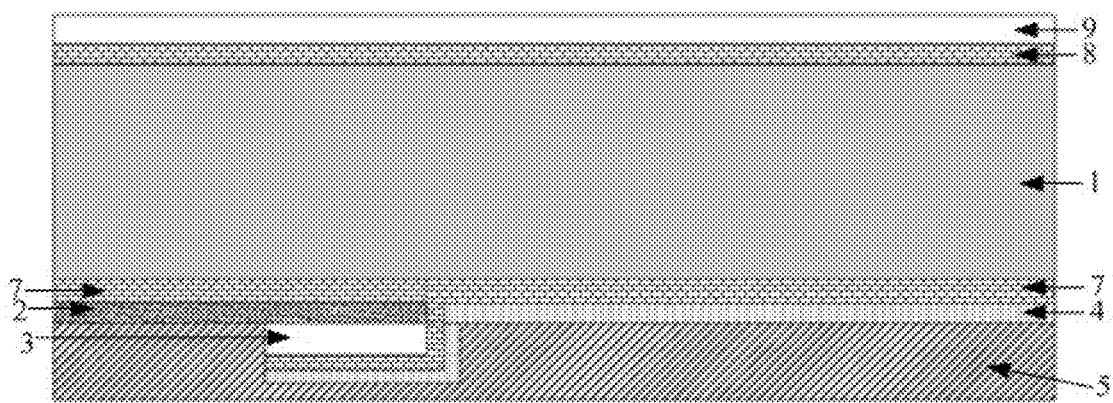
FIG. 16 is a schematic diagram of a partial structure of a twelfth type of back-contact solar cell according to an embodiment of the present invention.

FIG. 10 is a schematic diagram of a partial structure of a sixth type of back-contact solar cell according to an embodiment of the present invention. FIG. 11 is a schematic diagram of a partial structure of a seventh type of back-contact solar cell according to an embodiment of the present invention. FIG. 12 is a schematic diagram of a partial structure of an eighth type of back-contact solar cell according to an embodiment of the present invention. FIG. 13 is a schematic diagram of a partial structure of a ninth type of back-contact solar cell according to an embodiment of the present invention. FIG. 14 is a schematic diagram of a partial structure of a tenth type of back-contact solar cell according to an embodiment of the present invention. FIG. 15 is a schematic diagram of a partial structure of an eleventh type of back-contact solar cell according to an embodiment of the present invention. FIG. 16 is a schematic diagram of a partial structure of a twelfth type of back-contact solar cell according to an embodiment of the present invention.

The method may further include a step of preparing a solar-cell body. Specifically, first, a textured structure is formed on a light receiving surface of a silicon substrate 1 through chemical etching, and a back surface of the silicon substrate 1 is etched and polished by using an alkaline or acidic solution. As shown in FIG. 10, after the surface of the silicon substrate 1 is washed, a first passivation layer 7 and a first semiconductor layer 2 are deposited on a polished surface of the back surface of the silicon substrate 1, and an amorphous silicon passivation layer 8 and a silicon nitride (SiN$_x$) anti-reflection layer 9 are deposited on a texture of the light receiving surface of the silicon substrate 1. As shown in FIG. 11, a blocking layer 3 with a height of 100 nm to 500 nm is deposited on the back surface of the structure shown in FIG. 10 by using a low-temperature CVD (Chemical Vapor Deposition, chemical vapor deposition) process. As shown in FIG. 12, the blocking layer 3, the first semiconductor layer 2, and the first passivation layer 7 at a position opposite to a second region are removed by using a laser etching technology. Alternatively, the position opposite to the second region may be exposed through mask exposure. Then, the blocking layer 3 is removed by using an HF (hydrofluoric acid) solution, the first semiconductor layer 2 and the first passivation layer 7 are removed by using an alkaline solution, and a mask material is removed after patterning is completed. As shown in FIG. 13, the first passivation layer 7 and a second semiconductor layer 4 are deposited in the second region of the back surface of the silicon substrate 1 and on the back surface of the blocking layer 3. As shown in FIG. 14, the second semiconductor layer 4 and the first passivation layer 7 in a part of areas of the back surface of the blocking layer are removed by using the laser etching technology. Alternatively, the part of the areas of the back surface of the blocking layer are exposed through mask exposure. Then, the second semiconductor layer 4 and the first passivation layer 7 are removed by using an alkaline solution, and a material of a mask layer is removed after patterning is completed. As shown in FIG. 15, an end of the blocking layer 3 away from the second semiconductor layer 4 is removed by using a hydrofluoric acid solution. As shown in FIG. 16, a transparent conductive film layer is deposited on the entire back surface shown in FIG. 15, and the solar-cell body is formed so far.

The first electrode 11 and the second electrode 12 may be formed through electroplating. This is not specifically limited in the embodiments of the present invention.

The foregoing method for manufacturing a back-contact solar cell can achieve a beneficial effect the same as or similar to those of the back-contact solar cells described above. For related content of the two, reference can be made to each other. To avoid repetition, details are not described herein again.

It needs to be noted that, for ease of description, the method embodiments are described as a series of action combinations. However, a person skilled in the art should know that the embodiments of this application are not limited to the described order of actions, because some steps may be performed in another order or simultaneously according to the embodiments of this application. In addition, a person skilled in the art should also learn that, the embodiments described in this specification are all preferred embodiments, and actions involved are not necessarily all required in the embodiments of this application.

It needs to be noted that, in this specification, terms "include", "comprise", or any other variant thereof are intended to cover non-exclusive inclusion, so that a process, method, product, or apparatus that includes a series of elements includes not only the elements, but also another element not expressly listed, or an element inherent to such a process, method, product, or apparatus. An element defined by a statement "includes a . . . " does not exclude, without more limitations, existence of another same element in a process, method, product, or apparatus that includes the element.

According to the foregoing descriptions of the implementations, a person skilled in the art may clearly understand that the methods in the embodiments may be implemented by using software plus a necessary universal hardware platform, and certainly may alternatively be implemented by hardware. However, in many cases, the former is a better implementation. Based on this understanding, the technical solutions of the present invention essentially or a part contributing to the prior art may be implemented in a form of a software product. The computer software product is stored in a storage medium (such as a ROM/RAM, a magnetic disk, or an optical disc), and includes several instructions to enable a terminal (which may be a mobile phone, a computer, a server, an air conditioner, a network device, or the like) to perform the methods in the embodiments of the present invention.

The embodiments of the present invention are described above with reference to the accompanying drawings. However, the present invention is not limited to the foregoing specific implementations. The foregoing specific implementations are merely illustrative rather than restrictive. A person of ordinary skill in the art can make many forms in light of the present invention without departing from the spirit of the present invention and the protection scope of the claims. These forms all fall within the protection of the present invention.

What is claimed is:

1. A back-contact solar cell, comprising:
   a solar-cell body, comprising:
   a silicon substrate;
   a first semiconductor layer in a first region of a back surface of the silicon substrate;
   a second semiconductor layer having a portion in a second region of the back surface of the silicon substrate, wherein the second region is adjacent to the first region, wherein the first semiconductor layer and the second semiconductor layer have different doping types; and
   a transparent conductive film layer stacked on the first semiconductor layer and the second semiconductor layer; and
   an isolating groove extending through the second semiconductor layer and the transparent conductive film layer, wherein an area of a cross section of the isolating groove decreases towards the silicon substrate, and the cross section is parallel to the silicon substrate.

2. The back-contact solar cell according to claim 1, wherein a width of the isolating groove decreases towards the silicon substrate, wherein the width is measured along a direction the first region and the second region are arranged.

3. The back-contact solar cell according to claim 1, wherein the isolating groove is filled with an insulating material that is light-permeable.

4. The back-contact solar cell according to claim 3, wherein the insulating material forms a hat-like structure protruding from the isolating groove, wherein the hat-like structure comprises a brim part and a crown part further away from the isolating groove than the brim part, wherein an area of a cross section of the brim part is greater than an area of a cross section of the crown part,
   wherein the area of the cross section of the brim part increases towards the silicon substrate, and wherein a largest area of the cross section the brim part is greater than or equal to an area of the cross section of the isolating groove.

5. The back-contact solar cell according to claim 4, wherein a width of the brim part is greater than a width of of the crown part,
   wherein the width of the brim part increases towards the silicon substrate;
   wherein a largest width of the brim part is greater than or equal to a width of the isolating groove, and
   wherein the width is measured along a direction the first region and the second region are arranged.

6. The back-contact solar cell according to claim 5, wherein the isolating groove comprises a first side proximate to the silicon substrate and a second side away from the silicon substrate, wherein a width of the isolating groove at the first side of the isolating groove ranges from 10 μm to 80 μm, and the width of the isolating groove at the second side of the isolating groove ranges from 20 μm to 90 μm, and
   wherein the brim part comprises a first side proximate to the silicon substrate and a second side away from the silicon substrate, wherein a width of the brim part at the first side of the brim part ranges from 30 μm to 120 μm, and a width of the brim part at the second side of the brim part ranges from 20 μm to 110 μm.

7. The back-contact solar cell according to claim 3, further comprising a blocking layer between the first semiconductor layer and a portion of the second semiconductor layer in the first region,
   wherein a refractive index of the transparent conductive film layer and a refractive index of the second semiconductor layer are greater than a refractive index of the blocking layer.

8. The back-contact solar cell according to claim 7, wherein a refractive index of the insulating material is smaller than a refractive index of the blocking layer, and the refractive index of the blocking layer is smaller than a refractive index of the transparent conductive film layer and a refractive index of the second semiconductor layer.

9. The back-contact solar cell according to claim 8, wherein the refractive index of the insulating material ranges from 0.05 to 1.7, the refractive index of the transparent conductive film layer ranges from 1.86 to 4.9, the refractive index of the second semiconductor layer ranges from 1.86 to 4.9, and the refractive index of the blocking layer ranges from 1.85 to 2.1.

10. The back-contact solar cell according to claim 5, further comprising:
    a first electrode in a first region of the transparent conductive film layer that overlaps with the first semiconductor layer; and
    a second electrode in a second region of the transparent conductive film layer that overlaps with the second semiconductor layer,
    wherein the hat-like structure is located between the first electrode and the second electrode and protrudes further away from the transparent conductive film layer than the first electrode and the second electrode.

11. The back-contact solar cell according to claim 10, wherein the hat-like structure protrudes away from the transparent conductive film layer than the first electrode by a height ranging from 0.1 μm to 50 μm, and
    wherein the height is measured along a direction the first semiconductor layer and the silicon substrate are stacked.

12. The back-contact solar cell according to claim 1, wherein the isolating groove comprises a first groove portion contacting the second semiconductor layer and a second groove portion contacting the transparent conductive film layer,
    wherein the first groove portion and the second groove portion of the isolating groove each comprise a planar surface, wherein the first groove portion and the second groove portion of the isolating groove form a step structure or a smooth transition.

13. The back-contact solar cell according to claim 1, wherein the isolating groove comprises a first groove portion contacting the second semiconductor layer and a second groove portion contacting the transparent conductive film layer,
wherein the first groove portion and the second groove portion of the isolating groove each comprise a curvilinear surface, wherein curvilinear surfaces of the first groove portion and the second groove portion have a same curvature.

14. The back-contact solar cell according to claim 7, wherein the solar-cell body further comprises a first passivation layer between the second semiconductor layer and the silicon substrate in the second region, wherein a refractive index of the first passivation layer is greater than a refractive index of the blocking layer, and
wherein the isolating groove extends through the transparent conductive film layer, the second semiconductor layer and extends into the first passivation layer.

15. The back-contact solar cell according to claim 14, wherein the first passivation layer extends in the first region and is located between the first semiconductor layer and the silicon substrate.

16. The back-contact solar cell according to claim 14, wherein the silicon substrate is an N-type silicon substrate, the first semiconductor layer is a P-type doped microcrystalline silicon layer, the second semiconductor layer is an N+ doped amorphous silicon layer, the blocking layer is a silicon nitride blocking layer, and the first passivation layer is an amorphous silicon layer.

17. The back-contact solar cell according to claim 7, wherein a height of the blocking layer ranges from 100 nm to 500 nm, wherein the height is measured along a direction the first semiconductor layer and the silicon substrate are stacked.

18. The back-contact solar cell according to claim 1, wherein the back-contact solar cell further comprises:
an amorphous silicon passivation layer on a light receiving surface of the silicon substrate; and
a silicon nitride anti-reflection layer on the amorphous silicon passivation layer, wherein the light receiving surface of the silicon substrate has a textured structure.

19. A method for manufacturing a back-contact solar cell, comprising:
forming a solar-cell body comprising:
a silicon substrate;
a first semiconductor layer in a first region of a back surface of the silicon substrate;
a second semiconductor layer having a portion in a second region of the back surface of the silicon substrate, wherein the second region is adjacent to the first region, wherein the first semiconductor layer and the second semiconductor layer have different doping types; and
a transparent conductive film layer stacked on the first semiconductor layer and the second semiconductor layer; and
forming an isolating groove extending through the second semiconductor layer and the transparent conductive film layer, wherein an area of a cross section of the isolating groove decreases towards the silicon substrate, and the cross section is parallel to the silicon substrate.

20. A solar-cell assembly, comprising a back-contact solar cell comprising:
a solar-cell body, comprising:
a silicon substrate;
a first semiconductor layer in a first region of a back surface of the silicon substrate;
a second semiconductor layer having a portion in a second region of the back surface of the silicon substrate, wherein the second region is adjacent to the first region, wherein the first semiconductor layer and the second semiconductor layer have different doping types; and
a transparent conductive film layer stacked on the first semiconductor layer and the second semiconductor layer; and
an isolating groove extending through the second semiconductor layer and the transparent conductive film layer, wherein an area of a cross section of the isolating groove decreases towards the silicon substrate, and the cross section is parallel to the silicon substrate.

* * * * *